(12) United States Patent
Mok et al.

(10) Patent No.: US 8,664,950 B2
(45) Date of Patent: Mar. 4, 2014

(54) METHOD FOR MEASURING LONGITUDINAL BIAS MAGNETIC FIELD IN A TUNNEL MAGNETORESISTIVE SENSOR

(75) Inventors: Siuman Mok, Hong Kong (CN); Hokei Lam, Hong Kong (CN); Cheukwing Leung, Hong Kong (CN); Juren Ding, Hong Kong (CN); Rongkwang Ni, Hong Kong (CN); Wanyin Kwan, Hong Kong (CN); Cheukman Lui, Hong Kong (CN); Chiuming Lueng, Hong Kong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 207 days.

(21) Appl. No.: 13/067,887

(22) Filed: Jul. 1, 2011

(65) Prior Publication Data
US 2012/0249130 A1   Oct. 4, 2012

(30) Foreign Application Priority Data
Mar. 28, 2011   (CN) .......................... 2011 1 0074459

(51) Int. Cl.
*G01R 33/12* (2006.01)
(52) U.S. Cl.
USPC ........... 324/210; 324/252; 324/256; 324/249; 324/532; 324/535
(58) Field of Classification Search
USPC ......... 324/210–213, 207.2, 207.21, 244, 246, 324/249, 251, 252, 253, 256, 257, 259, 260, 324/532, 535
See application file for complete search history.

(56) References Cited

U.S. PATENT DOCUMENTS

| | | | | |
|---|---|---|---|---|
| 5,461,527 | A * | 10/1995 | Akiyama et al. | 360/327.32 |
| 6,110,609 | A * | 8/2000 | Hiramoto et al. | 428/812 |
| 6,593,739 | B1 * | 7/2003 | Argyle et al. | 324/244.1 |
| 6,856,132 | B2 * | 2/2005 | Appel et al. | 324/303 |
| 7,375,516 | B2 * | 5/2008 | Takenaga et al. | 324/252 |
| 2003/0099869 | A1 * | 5/2003 | Oikawa et al. | 428/694 TM |
| 2005/0073300 | A1 * | 4/2005 | Matsukuma et al. | 324/210 |
| 2005/0276997 | A1 * | 12/2005 | Hasegawa et al. | 428/811.3 |
| 2011/0065585 | A1 * | 3/2011 | Lanting et al. | 505/162 |

FOREIGN PATENT DOCUMENTS

JP   2009099167 A   *   5/2009

* cited by examiner

*Primary Examiner* — Jermele M Hollington
*Assistant Examiner* — Temilade S Rhodes-Vivour
(74) *Attorney, Agent, or Firm* — Nixon & Vanderhye, P.C.

(57) ABSTRACT

A method for measuring longitudinal bias magnetic field in a tunnel magnetoresistive sensor of a magnetic head, the method includes the steps of: applying an external longitudinal time-changing magnetic field onto the tunnel magnetoresistive sensor; determining a shield saturation value of the tunnel magnetoresistive sensor under the application of the external longitudinal time-changing magnetic field; applying an external transverse time-changing magnetic field and an external longitudinal DC magnetic field onto the tunnel magnetoresistive sensor; determining a plurality of different output amplitudes under the application of the external transverse time-changing magnetic field and the application of different field strength values of the external longitudinal DC magnetic field; plotting a graph according to the different output amplitudes and the different field strength values; and determining the strength of the longitudinal bias magnetic field according to the graph and the shield saturation value.

4 Claims, 13 Drawing Sheets

QST Curve/DC magnetic field strength strength=2000 Oe corresponding amplitude Vs external DC magnetic field

METHOD FOR MEASURING LONGITUDINAL BIAS MAGNETIC FIELD IN A TUNNEL MAGNETORESISTIVE SENSOR

This application claims the benefit of Chinese Patent Application No. 201110074459.2, filed 28 Mar. 2011, the entire contents of which is hereby incorporated by reference in this application.

FIELD OF THE INVENTION

The present invention relates to a method for testing the performance of a magnetic head, and more particularly to a method for measuring longitudinal bias magnetic field in a tunnel magnetoresistive (TMR) sensor of a magnetic head.

BACKGROUND OF THE INVENTION

Hard disk drive incorporating rotating magnetic disks is commonly used for storing data in the magnetic media formed on the disk surfaces, and a movable slider including read sensors are generally used to read data from tracks on the disk surfaces.

Presently, magnetoresistive (MR) read sensor, commonly referred to as MR sensor, is the prevailing read sensor because of its better capability to read data from a surface of a disk at greater track and linear densities than thin film inductive heads. Now, several types of MR sensors have been widely used by disk drive manufacturers in succession. One is anisotropic magnetoresistive (AMR) sensor, which makes the angle between the magnetization direction and the direction of sense current flowing through the MR element change and, in turn, cause a change the resistance of the MR element and a corresponding change in the sensed current or voltage. Another type is giant magnetoresistive (GMR) sensor manifesting the GMR effect. The GMR effect is a phenomenon that the magnetoresistive ratio (MRR) will change under an external time-changing magnetic field. The GMR sensor includes two ferromagnetic layers and a non-ferromagnetic layer sandwiched between the two ferromagnetic layers. The resistance of the non-ferromagnetic layers varies with the magnetic moments of the ferromagnetic layers, the conduction electrons and the spin-dependent scattering. Still another type of MR sensor is tunnel magnetoresistive (TMR) sensor, which includes a magnetic tunnel junction (MTJ) where the tunneling magneto-resistance effect (TMR effect) occurs. The TMR sensor has become the mainstream MR sensor due to its more remarkable change of MRR by replacing AMR sensor and GMR sensor.

As shown in FIG. 1, the TMR sensor 100 includes two shields 120, two hard magnets 130 and a magnetic tunnel junction (MTJ) 110 which is sandwiched between the shields 120 and the hard magnets 130. Referring to FIG. 2, the MTJ structure 110 includes a first ferromagnetic layer 111, a second ferromagnetic layer 112 and an anti-ferromagnetic (AFM) layer 113 which is formed in physical contact with the second ferromagnetic layer 112 to provide exchange bias magnetic field by exchange coupling at the interface of the layers. The magnetization direction in the second ferromagnetic layer 112 is constrained or maintained by the exchange coupling, thus the second ferromagnetic layer 112 is also called "pinned layer" 112. In general, the magnetization direction of the first ferromagnetic layer 111 is controlled by longitudinal bias magnetic field which is produced by the hard magnets 130. When an external magnetic field applied onto the TMR sensor is strong enough to compensate the longitudinal bias magnetic field, the magnetization direction of the first ferromagnetic layer 111 is free to rotate in response to the external applied magnetic field, thus the first ferromagnetic layer 111 is also called "free layer". The direction of the magnetization in the free layer 111 changes between parallel and anti-parallel against the direction of the magnetization in the pinned layer 112, and hence the tunneling magneto-resistance effect (TMR) characteristics are obtained.

In a TMR sensor, to suppress Barkhousen noise due to non-continuous magnetization by fluctuations or displacements of the magnetic domain boundaries, the bias magnetic field (longitudinal bias magnetic field) for controlling the magnetic domains is applied toward the longitudinal direction (track width direction). If this longitudinal bias magnetic field applied to the free layer is small, Barkhousen noise will be easily occurred. If the longitudinal bias magnetic field is large, the change in the magnetization direction of the free layer becomes difficult causing the sensing sensitivity of TMR sensor to be degraded. Therefore, it is necessary to apply an optimum amount of the longitudinal bias magnetic field in a TMR sensor. In order to implement it, it is very important to know the strength of the longitudinal bias magnetic field of the TMR sensor.

At present, a popular method for measuring longitudinal bias magnetic field in a TMR sensor is provided. It includes a step of applying high bias current or external heat source onto the TMR sensor so as to break the exchange coupling between the pinned layer and the AFM layer. Since the exchange coupling in the TMR sensor is so strong that the applied bias current or external heat source needs to be higher. However, as well known, higher bias current or heat source will bring higher temperature rise, under high temperature, the strength of longitudinal bias magnetic field will become lower and in result the longitudinal bias magnetic field can not be measured accurately. In addition, high temperature will induce high temperature noise, thereby destructing the performance of the TMR sensor.

Hence, it is desired to provide an improved method for accurately measuring longitudinal bias magnetic field in TMR sensor of a magnetic head.

SUMMARY OF THE INVENTION

One objective of the present invention is to provide a method for measuring longitudinal bias magnetic field in a tunnel magnetoresistive sensor so as to determine what kind of reader design can provide more stable and reliable reading performance for having suitable longitudinal bias magnetic field.

To achieve above objectives, the present invention provides a method for measuring longitudinal bias magnetic field in a tunnel magnetoresistive sensor of a magnetic head, the method including the steps of: (a) applying an external longitudinal time-changing magnetic field onto the tunnel magnetoresistive sensor, with a direction opposite to that of the longitudinal bias magnetic field; (b) determining a shield saturation value of the tunnel magnetoresistive sensor under the application of the external longitudinal time-changing magnetic field; (c) applying an external transverse time-changing magnetic field onto the tunnel magnetoresistive sensor, with a direction perpendicular to that of the longitudinal bias magnetic field; (d) applying an external longitudinal DC magnetic field, with a direction opposite to that of the longitudinal bias magnetic field; (e) determining a plurality of different output amplitudes under the application of the external transverse time-changing magnetic field and the application of different field strength values of the external longitudinal DC magnetic field; (f) plotting a graph according to the different output amplitudes and the different field strength values; and (g) determining the strength of the longitudinal bias magnetic field according to the graph and the shield saturation value.

Preferably, the step (b) includes the steps of: (b1) measuring quasi static responses of the tunnel magnetoresistive sensor to form a response curve under the application of the external longitudinal time-changing magnetic field; and (b2) determining the shield saturation value of the tunnel magnetoresistive sensor according to the response curve.

Preferably, the step (e) includes the steps of: (e1) determining an original output amplitude under the application of the external transverse time-changing magnetic field when the field strength value of the external longitudinal DC magnetic field is zero; (e2) changing the field strength value of the external longitudinal DC magnetic field by adding an increment; (e3) determining an changed output amplitude under the application of the external transverse time-changing magnetic field and the application of the changed field strength value of the external longitudinal DC magnetic field; and (e4) repeating step (e2) to step (e3) until the changed field strength value is bigger than the shield saturation value and the value of the changed output amplitude is smaller than the value of the original output amplitude.

Preferably, the step (g) includes the steps of: (g1) determining the final field strength value corresponding to the maximum output amplitude in the graph; and (g2) determining the strength of the longitudinal bias magnetic field by subtracting the shield saturation value from the final field strength value.

Preferably, the external longitudinal time-changing magnetic field, the external transverse time-changing magnetic field and the external longitudinal DC magnetic field are all produced by a vector coil assembly.

In comparison with the prior art, the present invention provides a method for accurately measuring longitudinal bias magnetic field in a tunnel magnetoresistive sensor. In this method, since an external magnetic field is provided to replace high bias current or external heat source to break the exchange coupling in the tunnel magnetoresistive sensor, higher temperature rise of the tunnel magnetoresistive sensor is avoided. Thus, the longitudinal bias magnetic field in a tunnel magnetoresistive sensor can be measured accurately so as to determine what kind of TMR reader design can provide more stable and reliable reading performance.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
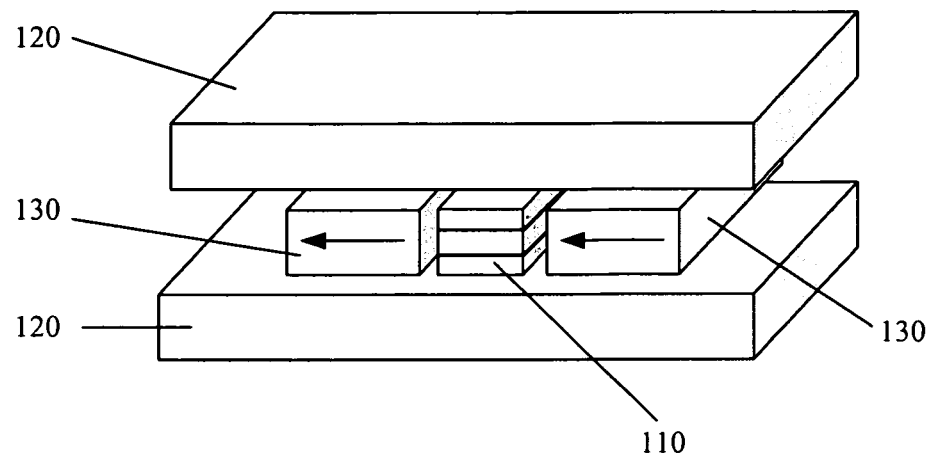
FIG. 1 is a schematic diagram illustrating a structure of a conventional TMR sensor.

Various preferred embodiments of the invention will now be described with reference to the figures, wherein like reference numerals designate similar parts throughout the various views. As indicated above, the invention is directed to a method for measuring longitudinal bias magnetic field in a tunnel magnetoresistive sensor of a magnetic head, the method including the steps of: (a) applying an external longitudinal time-changing magnetic field onto the tunnel magnetoresistive sensor, with a direction opposite to that of the longitudinal bias magnetic field; (b) determining a shield saturation value of the tunnel magnetoresistive sensor under the application of the external longitudinal time-changing magnetic field; (c) applying an external transverse time-changing magnetic field onto the tunnel magnetoresistive sensor, with a direction perpendicular to that of the longitudinal bias magnetic field; (d) applying an external longitudinal DC magnetic field, with a direction opposite to that of the longitudinal bias magnetic field; (e) determining a plurality of different output amplitudes under the application of the external transverse time-changing magnetic field and the application of different field strength values of the external longitudinal DC magnetic field; (f) plotting a graph according to the different output amplitudes and the different field strength values; and (g) determining the strength of the longitudinal bias magnetic field according to the graph and the shield saturation value. The method of the present invention can accurately measure the strength of longitudinal bias magnetic field in a tunnel magnetoresistive sensor so as to determine what kind of reader design can provide more stable and reliable reading performance for having suitable longitudinal bias magnetic field.

Figure 3:
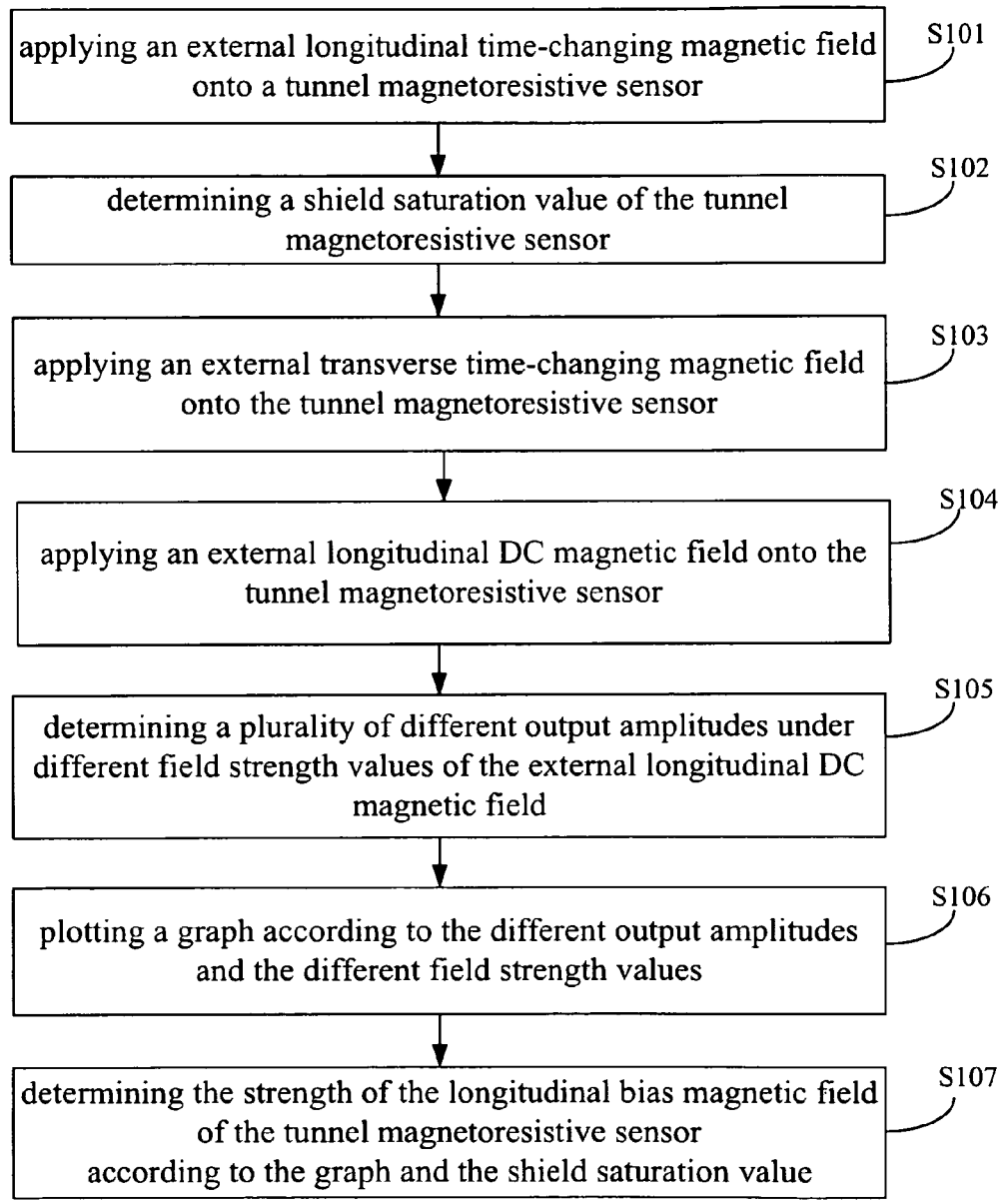
FIG. 3 is a flowchart showing a method for measuring longitudinal bias magnetic field in the tunnel magnetoresistive sensor shown in FIG. 1, according to an embodiment of the present invention.

FIG. 3 is a flowchart showing a method for measuring longitudinal bias magnetic field in the tunnel magnetoresistive sensor shown in FIG. 1. Now, referring to FIG. 3, according to an embodiment of the present invention, the method for measuring longitudinal bias magnetic field in a tunnel magnetoresistive sensor includes the steps as follows: applying an external longitudinal time-changing magnetic field onto the tunnel magnetoresistive sensor, the direction of the external longitudinal time-changing magnetic field being opposite to that of the longitudinal bias magnetic field (step S101); determining a shield saturation value of the tunnel magnetoresistive sensor under the application of the external longitudinal time-changing magnetic field (step S102); applying an external transverse time-changing magnetic field onto the tunnel magnetoresistive sensor, the direction of the external transverse time-changing magnetic field being perpendicular to that of the longitudinal bias magnetic field (step S103); applying an external longitudinal DC magnetic field, with a direction opposite to that of the longitudinal bias magnetic field (step S104); determining a plurality of different output amplitudes under the application of the external transverse time-changing magnetic field and the application of different field strength values of the external longitudinal DC magnetic field (step S105); plotting a graph according to the different output amplitudes and the different field strength values (step S106); and determining the strength of the longitudinal bias magnetic field according to the graph and the shield saturation value (step S107).

Figure 2:
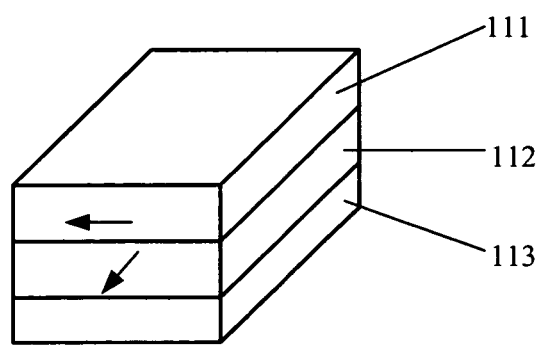
FIG. 2 is a schematic diagram illustrating a MTJ structure of the TMR sensor shown in FIG. 1.
Figure 2:
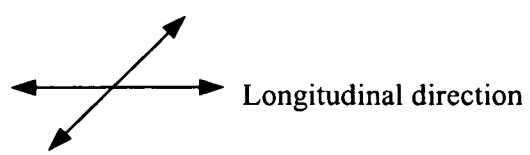
Figure 4:
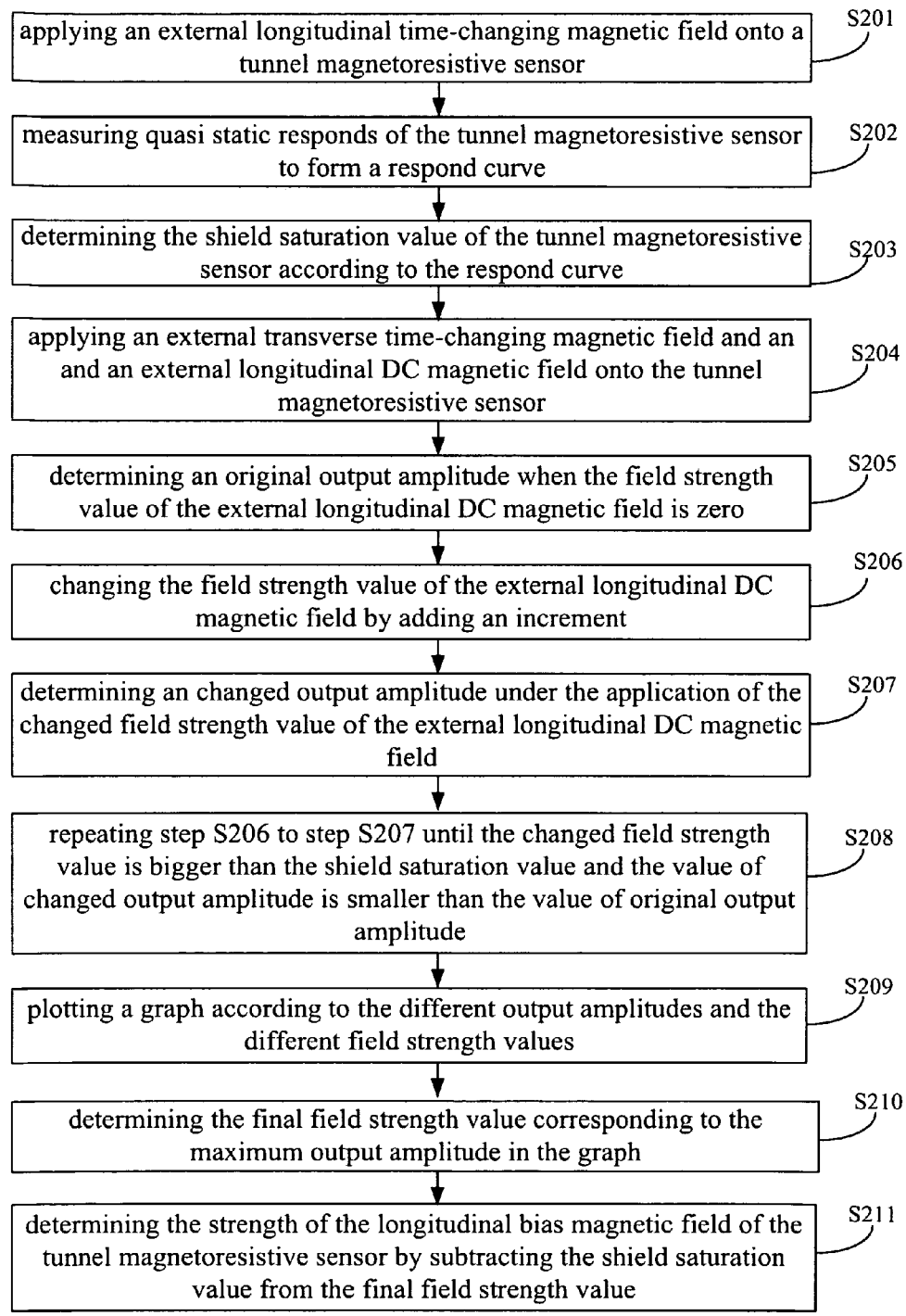
FIG. 4 is another flowchart showing a method for measuring longitudinal bias magnetic field in the tunnel magnetoresistive sensor shown in FIG. 1, according to another embodiment of the present invention.

As shown in FIG. 4, according to a preferred embodiment of the present invention, a method for measuring longitudinal bias magnetic field in the tunnel magnetoresistive sensor includes the steps as follows:

Firstly, applying an external longitudinal time-changing magnetic field onto the tunnel magnetoresistive sensor (step S201). As shown in FIG. 2 and FIG. 5b, the direction of the external longitudinal time-changing magnetic field E is opposite to the direction of the longitudinal bias magnetic field in the free layer 111 of the tunnel magnetoresistive sensor. Then, measuring quasi static responses of the tunnel magnetoresistive sensor to form a response curve under the application of the external longitudinal time-changing magnetic field (step S202) and determining the shield saturation value of the tunnel magnetoresistive sensor according to the response curve (step S203). It is well known that the shield of the tunnel magnetoresistive sensor will absorb the external magnetic field when the external magnetic field is applied onto the tunnel magnetoresistive sensor. Parameter "shield saturation" is introduced to describe the characteristic of the shield. When achieving shield saturation, the shield will not absorb the external magnetic field any more. At this moment, a sudden response occurs on the response curves.

Next, applying an external transverse time-changing magnetic field and an external longitudinal DC magnetic field onto the tunnel magnetoresistive sensor (step S204). As shown in FIG. 2, FIG. 5b and FIG. 6b, the direction of the external transverse time-changing magnetic field C is perpendicular to the direction of the longitudinal bias magnetic field and the external longitudinal time-changing magnetic field E, while the direction of the external longitudinal DC magnetic field E' is the same as that of the longitudinal time-changing magnetic field E whose direction is opposite to that of the longitudinal bias magnetic field. Then, determining an original output amplitude under the application of the external transverse time-changing magnetic field when the field strength value of the external longitudinal DC magnetic field is zero (step S205). After that, a plurality of different output amplitudes can be determined by implementing the following steps: changing the field strength value of the external longitudinal DC magnetic field by adding an increment (step S206) (wherein, the increment is a variable factor which will affect the measurement precision, in this embodiment, the increment of the field strength value can be 100 Oe or 200 Oe and so on); determining a changed output amplitude under the application of the external transverse time-changing magnetic field and the application of the changed field strength value of the external longitudinal DC magnetic field (step S207); repeating step S206 to step S207 until the changed field strength value is bigger than the shield saturation value and the value of changed output amplitude is smaller than the value of original output amplitude (step S208). After implementing above steps, plotting a graph according to the different output amplitudes and the different field strength values (step S209).

According to the method of the present invention, the longitudinal DC magnetic field is proved to change the free degree of the free layer of the tunnel magnetoresistive sensor. When the longitudinal DC magnetic field is strong enough to compensate the longitudinal bias magnetic field completely, the free layer achieves a most free state. When the free layer becomes most free, maximum output amplitude of the magnetic head can be obtained. Further more, for the tunnel magnetoresistive sensor, the shield will absorb the external magnetic field before achieving a saturation state. Thus, based on above characteristic, the strength of the longitudinal bias magnetic field can be determined by implementing the following steps: determining the final field strength value corresponding to the maximum output amplitude in the graph (step S210) and determining the strength of the longitudinal bias magnetic field by subtracting the shield saturation value from the final field strength value (step S211).

Figure 5A:
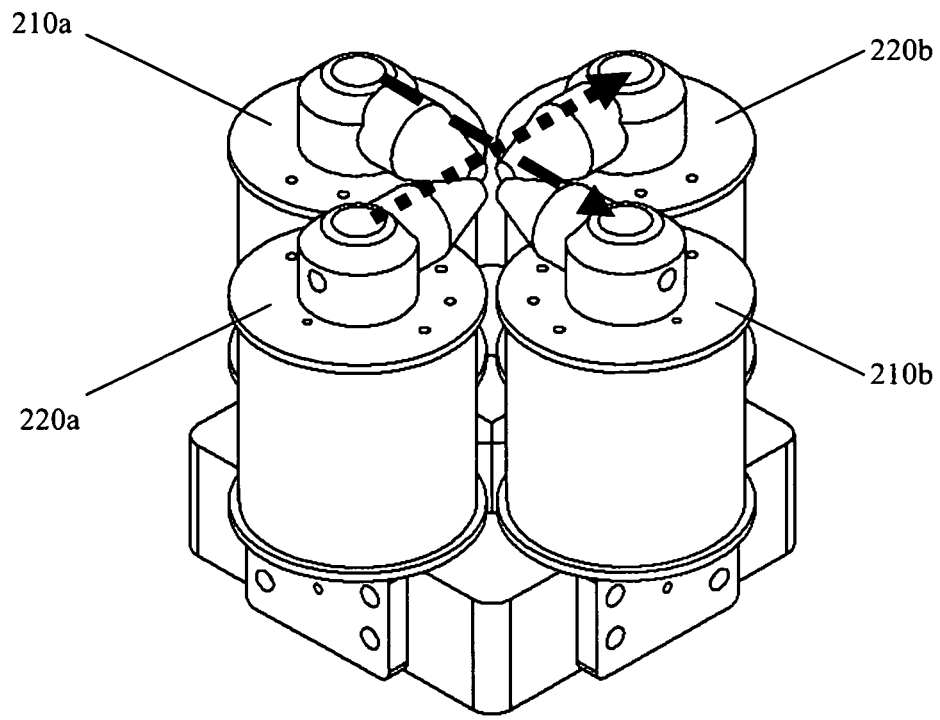
FIG. 5*a* is a schematic diagram illustrating a vector coil assembly provided for producing an external longitudinal time-changing magnetic field or an external longitudinal DC magnetic field.
Figure 5B:
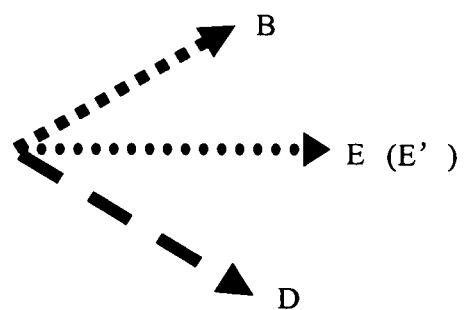
FIG. 5*b* a schematic diagram showing how to form an external longitudinal time-changing magnetic field or an external longitudinal DC magnetic field.
Figure 6A:
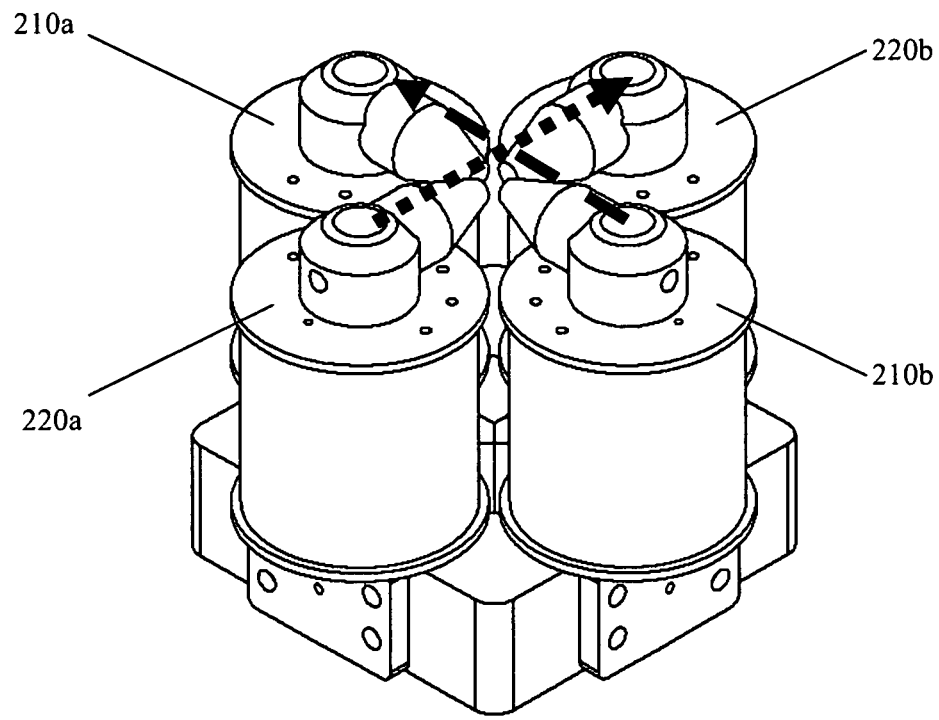
FIG. 6*a* is a schematic diagram illustrating a vector coil assembly provided for producing an external transverse time-changing magnetic field.
Figure 6B:
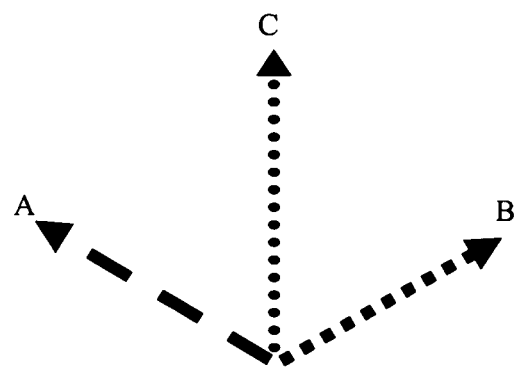
FIG. 6*b* a schematic diagram showing how to form an external transverse time-changing magnetic field.

In this embodiment, the external longitudinal time-changing magnetic field, the external transverse time-changing magnetic field and the external longitudinal DC magnetic field are all produced by a vector coil assembly 200 shown in FIG. 5a and FIG. 5b. Referring to FIGS. 5a-6b, the vector coil assembly includes four vector coils 210a, 210b, 220a and 220b. The vector coils 210a and 210b are provided to constitute a first pair of vector coils, similarly, the vector coils 220a and 220b are provided to constitute a second pair of vector coils. The first pair of vector coils is provided for producing a magnetic field A and a magnetic field D whose direction is opposite to that of the magnetic field A. The second pair of vector coils is provided for producing a magnetic field B whose direction is perpendicular to that of the magnetic field A and magnetic field D. In this embodiment, the external transverse time-changing magnetic field C is composed by the magnetic field A and magnetic field B, and according to the Pythagoras' Theorem, the value of the external transverse time-changing magnetic field can be calculated by the formula: $C=(A^2+B^2)^{1/2}$; in the same way, the external longitudinal time-changing magnetic field E and the external longitudinal DC magnetic field E' can be composed by the magnetic field B and magnetic field D and according to the Pythagoras' Theorem, the value of the external longitudinal time-changing magnetic field and the value of the external longitudinal DC magnetic field can be respectively calculated by the formulas: $E=(B^2+D^2)^{1/2}$ and $E'=(B^2+D^2)^{1/2}$.

Figure 7:
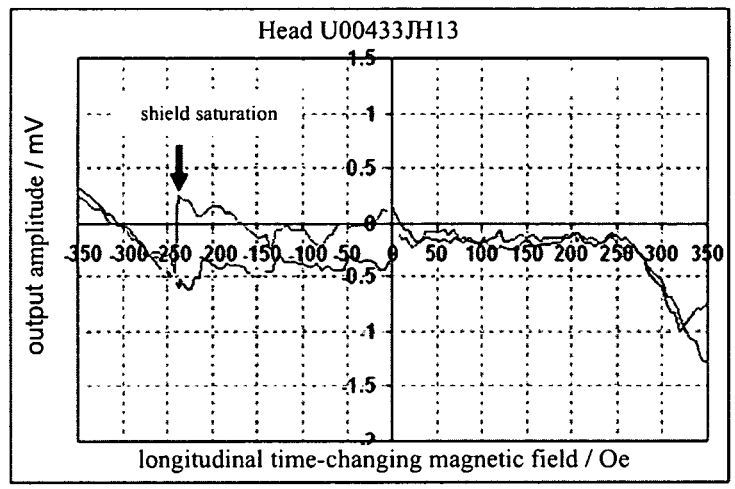
FIG. 7 is a response curve showing how to determine the shield saturation of the tunnel magnetoresistive sensor.

To illustrate the measuring method of the present invention more detailedly, there are two magnetic heads with tunnel magnetoresistive sensor provided for testing by this method. One is called head U00433JH13, the other one is called head U00436JH13. According to the preferred embodiment of the present invention, the measurement of these two magnetic heads will be described as follows:

For the head U00433JH13, as shown in FIG. 7, after applying the external longitudinal time-changing magnetic field onto the tunnel magnetoresistive sensor of head U00433JH13, a response curve is formed by measuring quasi static responses of the tunnel magnetoresistive sensor. Since the shield of the TMR sensor achieves a saturation point when a sudden response occurs on the response curve, according to the response curves shown in FIG. 7, it is easy to determine that the shield saturation value is 236 Oe.

Figure 8:
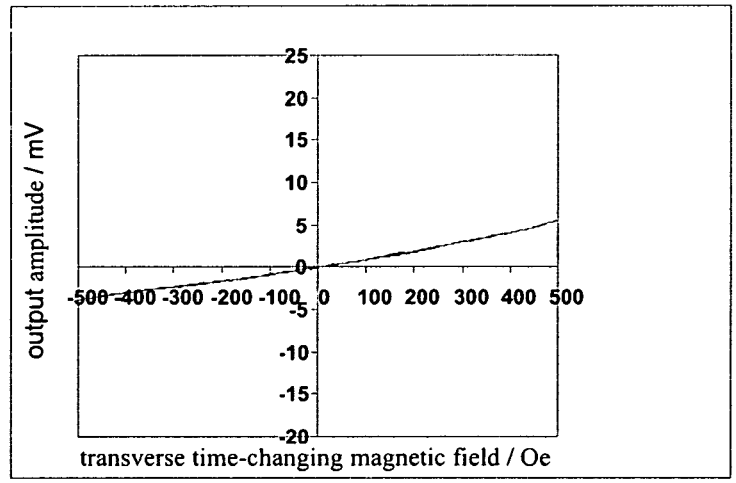
FIG. 8. shows an original quasi static testing (QST) curve for determining an original output amplitude.

Referring to FIG. 8, it shows an original quasi static testing (QST) curve when the field strength value of the external longitudinal DC magnetic field is zero. Based on such a curve, it can be obtained that the value of original output amplitude is 9.37 mV. Thus, a first set of data (0 Oe, 9.37 mV) about the field strength and the output amplitude is determined.

Figure 9:
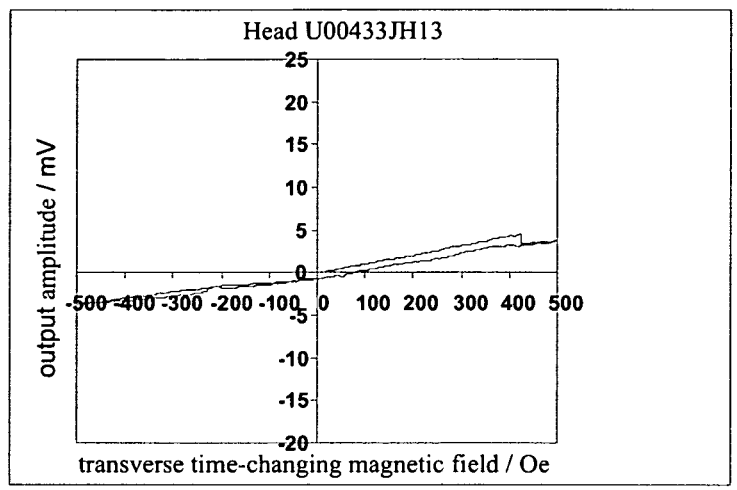
FIGS. 9-21 show different QST curves formed under different field strength values of the external longitudinal DC magnetic field.
Figure 10:
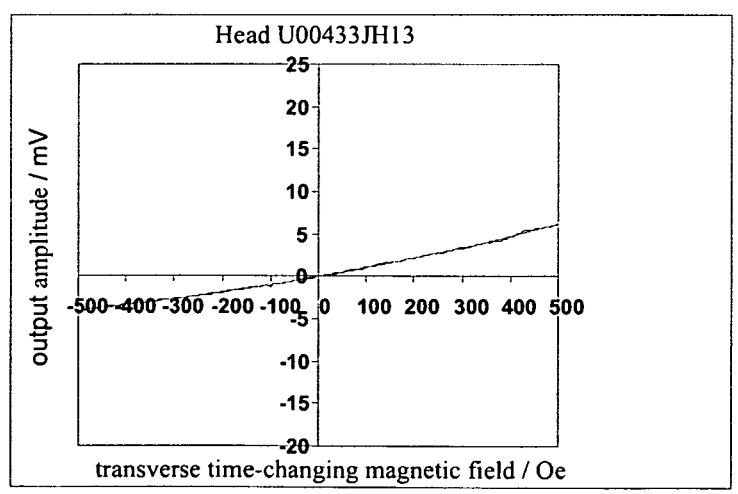
Figure 11:
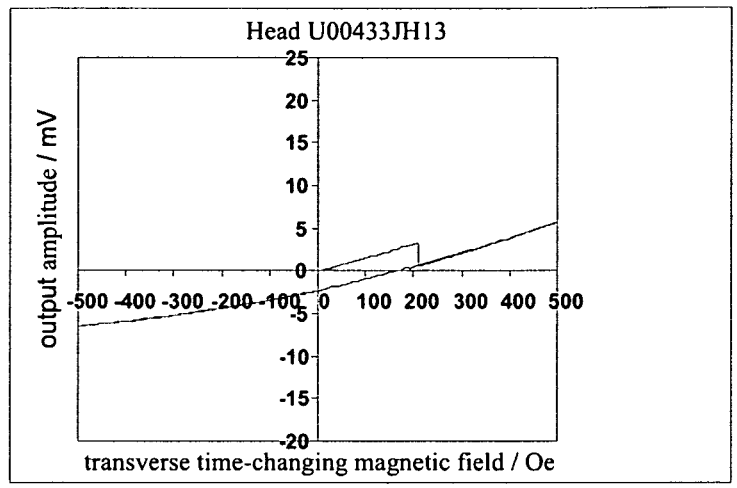
Figure 12:
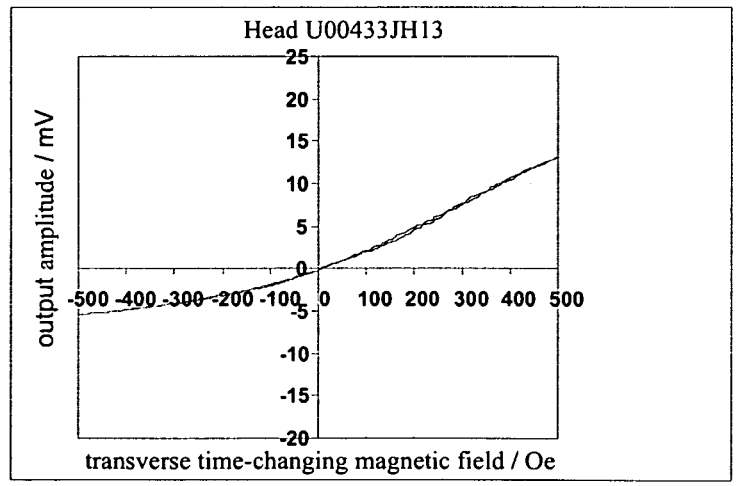
Figure 13:
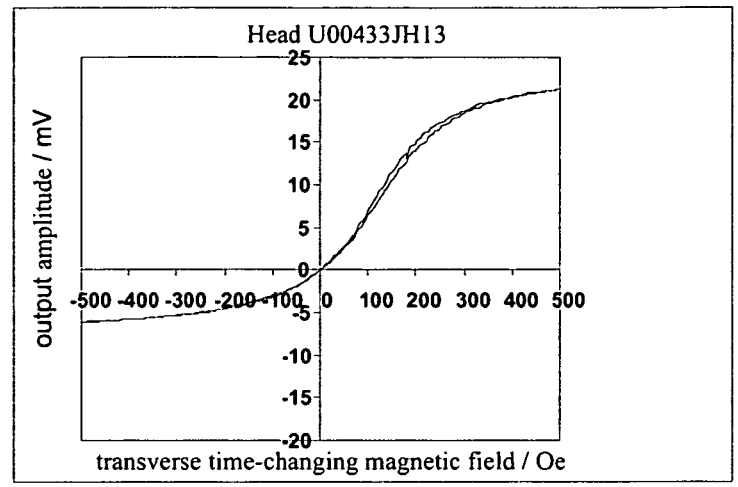
Figure 14:
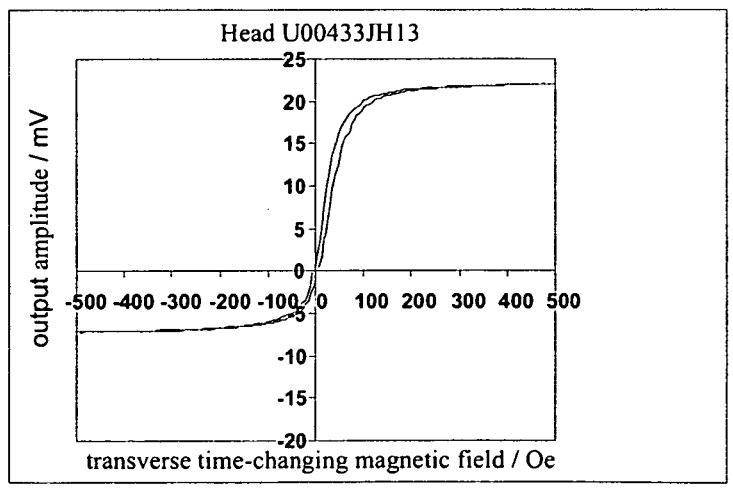
Figure 15:
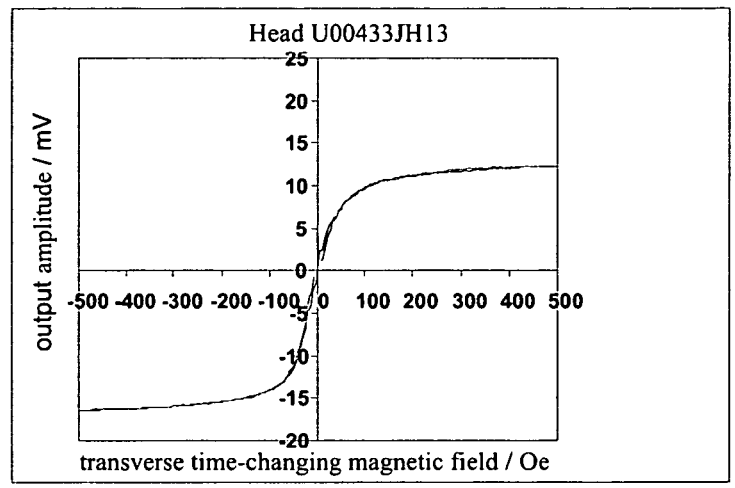

As shown in FIG. 9, the field strength value of the external longitudinal DC magnetic field is increased to 200 Oe, under such a condition, the output amplitude is changed to 8.17 mV, thereby obtaining a second set of data (200 Oe, 8.17 mV). Because the field strength value "200 Oe" is smaller than the shield saturation value "236 Oe", the step S206 and step S207 continues to be implemented to form another QST curve (shown in FIG. 10). According to FIG. 10, it can be obtained that the output amplitude is changed to 10.29 mV when the field strength value is increased to 400 Oe, thus, another set of data (400 Oe, 10.29 mV) can be obtained. Now, the field strength value "400 Oe" is bigger than the shield saturation value "236 Oe", but the changed output amplitude "10.29 mV" is not smaller than the original output amplitude "9.37 mV", thus, the step S206 and step S207 still need to be implemented to obtain other output amplitudes.

Figure 16:
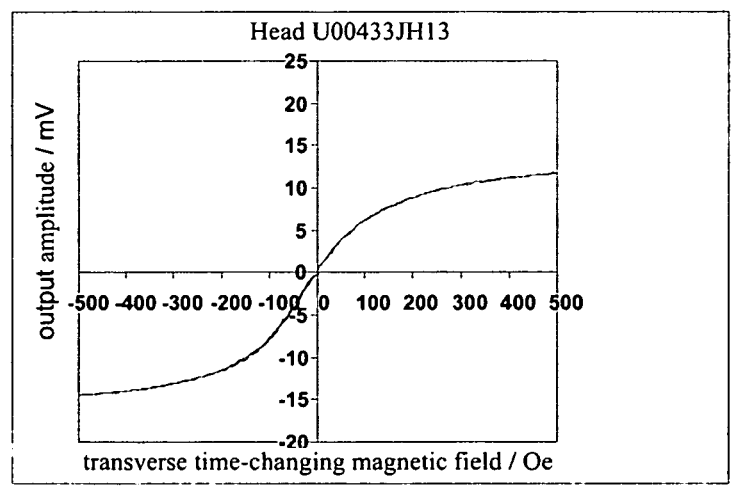
Figure 17:
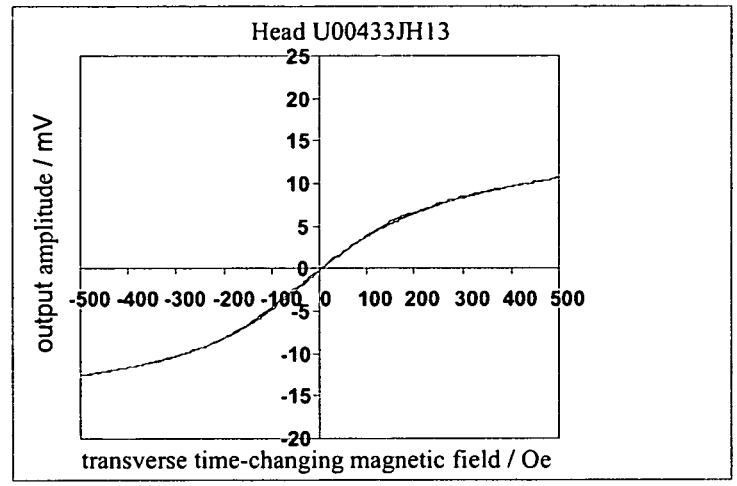
Figure 18:
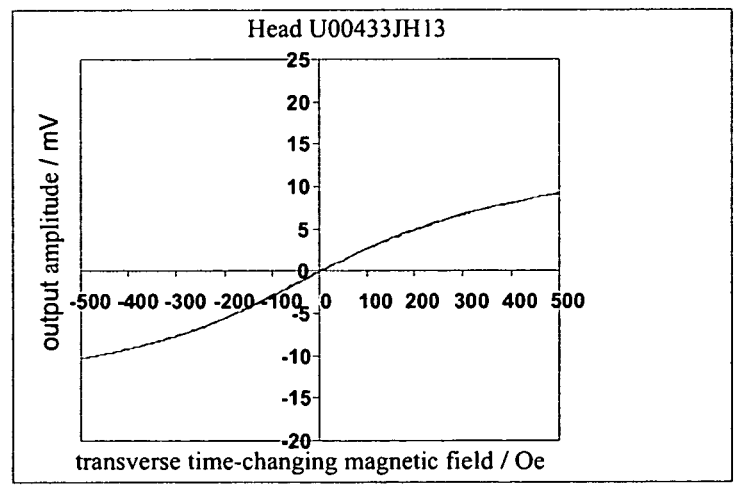
Figure 19:
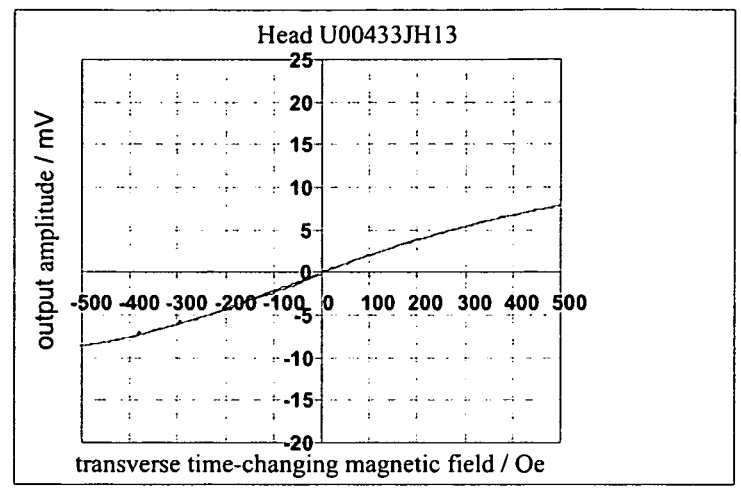
Figure 20:
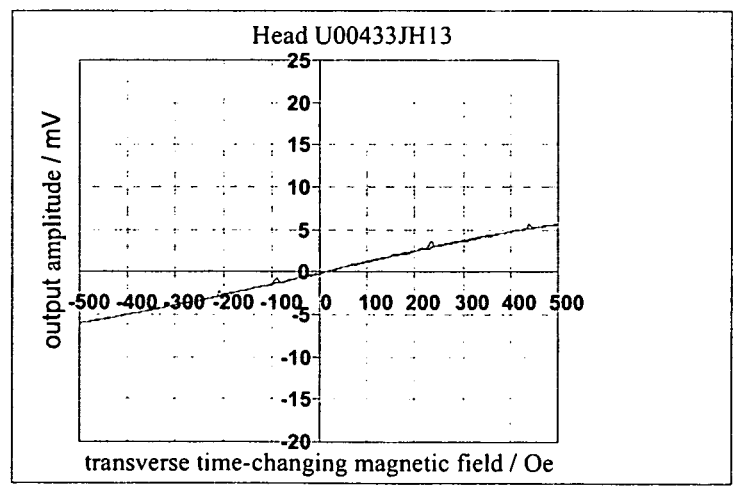
Figure 21:
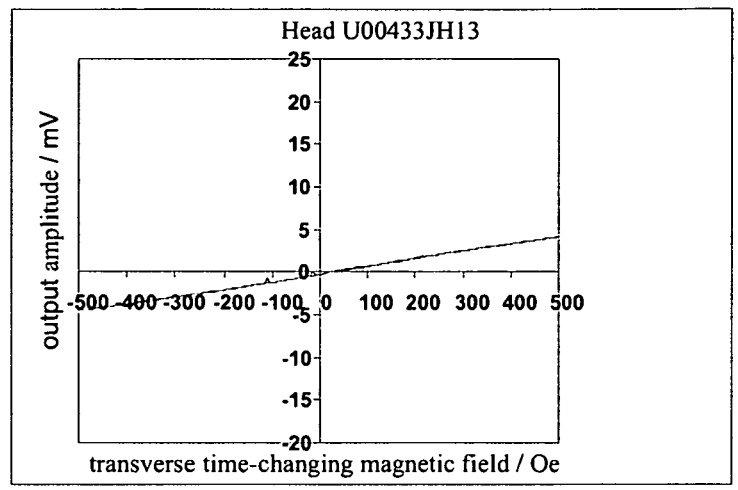

FIG. 11 to FIG. 21 shows the rest of QST curves formed by repeating step S206 to step S207. Based on this, a series of data about the about the field strength and the output amplitude can be obtained, for example, when the field strength value of DC magnetic field is 600 Oe, the value of output amplitude is increased to 12.21 mV, and when the field strength value is 1100 Oe, the output amplitude reaches to 29.29 mV, but when the field strength value is 1200 Oe, the output amplitude is reduced to 28.73 mV. Finally, as shown in FIG. 16, when the field strength value is increased to 2000 Oe, the corresponding output amplitude is reduced to 8.71 mV which is smaller than the original output amplitude, it means that the data obtained by repeating the step S206 to step S208 is so much that can plot a graph for determining the strength of the longitudinal bias magnetic field.

Figure 22:
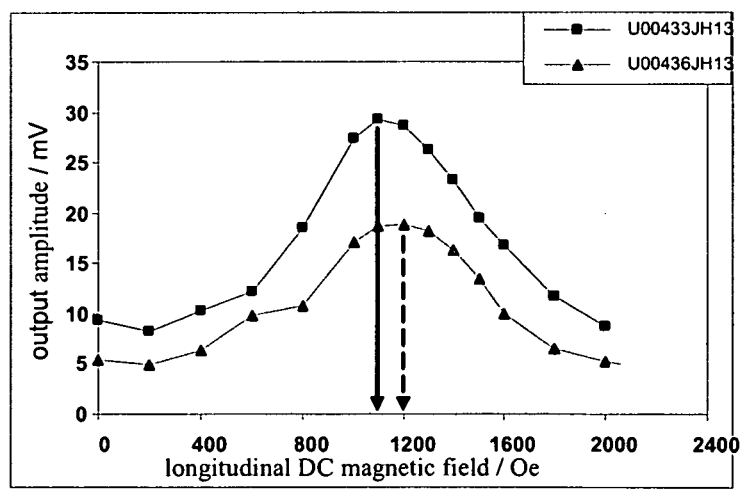
FIG. 22 is a graph showing how to determine the strength of the longitudinal bias magnetic field.

Based on above testing result, the graph of the head U00433JH13 is plotted for determining the final field strength value, as shown in FIG. 22. It can be obtained from the graph that the maximum output amplitude is 29.29 mV and the final field strength value corresponding to the maximum output amplitude is 1,100 Oe. Since the shield saturation value is 236 Oe, the strength of the longitudinal bias magnetic field is easy to be obtained by subtracting 236 Oe from 1100 Oe; thereby the strength value of the longitudinal bias magnetic field is 864 Oe. Similarly, for the head U00436 JH13, several similar QST curves (not shown) can be obtained and according these QST curves, the graph of the head U00436 JH13 is plotted as shown in FIG. 22 for determining the strength of the longitudinal bias magnetic field therein. Thereby it can be determined which design of above two heads can provide more stable and reliable reading performance by comparing their longitudinal bias magnetic fields.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A method for measuring longitudinal bias magnetic field in a tunnel magnetoresistive sensor of a magnetic head, the method comprising:
   (a) applying an external longitudinal time-changing magnetic field onto the tunnel magnetoresistive sensor, with a direction opposite to that of the longitudinal bias magnetic field;
   (b) determining a shield saturation value of the tunnel magnetoresistive sensor under the application of the external longitudinal time-changing magnetic field;
   (c) applying an external transverse time-changing magnetic field onto the tunnel magnetoresistive sensor, with a direction perpendicular to that of the longitudinal bias magnetic field;
   (d) applying an external longitudinal DC magnetic field, with a direction opposite to that of the longitudinal bias magnetic field;
   (e) determining a plurality of different output amplitudes under the application of the external transverse time-changing magnetic field and the application of different field strength values of the external longitudinal DC magnetic field;
   (f) plotting a graph according to the different output amplitudes and the different field strength values; and
   (g) determining the strength of the longitudinal bias magnetic field according to the graph and the shield saturation value,
   wherein (g) further comprises:
      (g1) determining the final field strength value corresponding to the maximum output amplitude in the graph; and
      (g2) determining the strength of the longitudinal bias magnetic field by subtracting the shield saturation value from the final field strength value.

2. The method as claimed in claim 1, wherein (b) further comprises:
   (b1) measuring quasi static responses of the tunnel magnetoresistive sensor to form a response curve under the application of the external longitudinal time-changing magnetic field; and
   (b2) determining the shield saturation value of the tunnel magnetoresistive sensor according to the response curve.

3. The method as claimed in claim 1, wherein the external longitudinal time-changing magnetic field, the external transverse time-changing magnetic field and the external longitudinal DC magnetic field are all produced by a vector coil assembly.

4. A method for measuring longitudinal bias magnetic field in a tunnel magnetoresistive sensor of a magnetic head, the method comprising:
   (a) applying an external longitudinal time-changing magnetic field onto the tunnel magnetoresistive sensor, with a direction opposite to that of the longitudinal bias magnetic field;
   (b) determining a shield saturation value of the tunnel magnetoresistive sensor under the application of the external longitudinal time-changing magnetic field;
   (c) applying an external transverse time-changing magnetic field onto the tunnel magnetoresistive sensor, with a direction perpendicular to that of the longitudinal bias magnetic field:
   (d) applying an external longitudinal DC magnetic field, with a direction opposite to that of the longitudinal bias magnetic field;
   (e) determining a plurality of different output amplitudes under the application of the external transverse time-changing magnetic field and the application of different field strength values of the external longitudinal DC magnetic field;
   (f) plotting a graph according to the different output amplitudes and the different field strength values; and (g) determining the strength of the longitudinal bias magnetic field according to the graph and the shield saturation value, wherein (e) further comprises:

(e1) determining an original output amplitude under the application of the external transverse time-changing magnetic field when the field strength value of the external longitudinal DC magnetic field is zero;

(e2) changing the field strength value of the external longitudinal DC magnetic field by adding an increment;

(e3) determining a changed output amplitude under the application of the external transverse time-changing magnetic field and the application of the changed field strength value of the external longitudinal DC magnetic field; and (e4) repeating (e2) to (e3) until the changed field strength value is bigger than the shield saturation value and the value of the changed output amplitude is smaller than the value of the original output amplitude.

* * * * *